US009036405B1

United States Patent
Giridhar et al.

(10) Patent No.: US 9,036,405 B1
(45) Date of Patent: May 19, 2015

(54) MEMORY SENSE AMPLIFIER WITH MULTIPLE MODES OF OPERATION

(71) Applicants: Bharan Giridhar, Ann Arbor, MI (US); David Theodore Blaauw, Ann Arbor, MI (US); Dennis Michael Sylvester, Ann Arbor, MI (US)

(72) Inventors: Bharan Giridhar, Ann Arbor, MI (US); David Theodore Blaauw, Ann Arbor, MI (US); Dennis Michael Sylvester, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/092,395

(22) Filed: Nov. 27, 2013

(51) Int. Cl.
*G11C 11/419* (2006.01)
*G11C 7/06* (2006.01)

(52) U.S. Cl.
CPC ............ *G11C 7/065* (2013.01); *G11C 11/419* (2013.01); *G11C 7/06* (2013.01); *G11C 7/062* (2013.01)

(58) Field of Classification Search
CPC .... G11C 7/065; G11C 11/4091; G11C 7/062; G11C 7/06
USPC ........................................................ 365/154
See application file for complete search history.

(56) References Cited

U.S. PATENT DOCUMENTS

| | | | |
|---|---|---|---|
| 2008/0091755 A1* | 4/2008 | Mudge et al. | 708/250 |
| 2010/0329056 A1* | 12/2010 | Moon | 365/203 |
| 2011/0182129 A1* | 7/2011 | Lee | 365/207 |
| 2014/0003160 A1* | 1/2014 | Trivedi et al. | 365/189.02 |
| 2014/0192603 A1* | 7/2014 | Singh | 365/203 |

OTHER PUBLICATIONS

Schinkel, D. et al., "A double tail latch type voltage sense amplifier with 18ps setup+hold time", Analog Techniques and PLLs, Session 17, (2007), 3 pages.
Verma, N. et al., "A high density 45nm SRAM using small-signal non-strobed egenerativesensing", ISSCC, (2008), 25 pages.
Qazi, M. et al., "A 512kb 8T SRAM macro operating down to 0.57 with an AN-coupled sense amplifier and embedded data retention voltage sensor in 45nm SOI CMOS", Solid State Circuits Conference Digest of Technical Papers (ISSCC), (2010), pp. 350-351.
Verma, N. et al., "A 65nm 8T sub-vt SRAM employing sense-amplifier redundancy", ISSCC, (2007), 23 pages.

* cited by examiner

*Primary Examiner* — Hoai V Ho
*Assistant Examiner* — Roberto Mancera
(74) *Attorney, Agent, or Firm* — Nixon & Vanderhye P.C.

(57) ABSTRACT

Memory circuitry comprising an array of 6T bit cells 6 in which columns of bit cells are coupled together via bit line pairs 8 connected to respective sense amplifier circuitry 10 is provided. The sense amplifier circuitry includes an inverter pair 12, 14 and control circuitry which is configured to control the sense amplifier circuitry to operate in a plurality of modes including an offset compensation mode, an amplification mode and a latching mode.

13 Claims, 8 Drawing Sheets

US 9,036,405 B1

MEMORY SENSE AMPLIFIER WITH MULTIPLE MODES OF OPERATION

BACKGROUND OF THE INVENTION

1. Field of the Invention

This invention relates to the field of memory circuitry. More particularly, this invention relates to the control and configuration of sense amplifiers for use in sensing differential voltages between bit lines when reading data from an array of bit cells within memory circuitry.

2. Description of the Prior Art

It is known to provide memory circuitry comprising an array of bit cells within which columns of bit cells are connected by bit line pairs. The bit line pairs are precharged to a given voltage and then one of the bit lines of the pair is discharged depending upon the contents of the bit cell within a column that is being read. The difference in voltage which arises between the bit lines of the bit line pair as a result of this discharge is sensed by sense amplifier circuitry coupled to the bit lines.

A performance parameter that is desirable to improve for a memory is the speed with which data can be read therefrom. One factor limiting this speed is the amount of time needed for a sense amplifier to sense the voltage difference which arises between bit lines when being read in accordance with the above. Furthermore, a problem with sense amplifier circuitry as devices become smaller is that mismatches between the circuit elements in the sense amplifier circuitry can give rise to failure or poor performance. In particular, sense amplifiers may contain a pair of inverters which are cross-coupled. If the inverters are not well matched, then they may be switched incorrectly, or switched more slowly, by the voltage difference arising between the bit lines in the expected manner. One way of dealing with this is to make the circuit elements including at least the inverters larger than would otherwise be necessary so that mismatches can be reduced. However, making the inverters larger than is necessary is disadvantageous from an area and circuit density point of view.

SUMMARY OF THE INVENTION

Viewed from one aspect the present invention provides a memory circuitry comprising:

an array of bit cells comprising a plurality of columns of bit cells;

a plurality of bit lines pairs each coupled to a respective column of bit cells within said array; and sense amplifier circuitry coupled to at least one of said plurality of bit line pairs and configured to sense a voltage difference between bit lines of said at least one of said plurality of bit line pairs; wherein said sense amplifier circuitry comprises an inverter pair and control circuitry configured to control said sense amplifier circuitry to operate in a plurality of modes including:

(i) an offset compensation mode in which said inverter pair is isolated from said bit lines and each inverter of said inverter pair adopts a state corresponding to a trip point at which an input voltage of said inverter is substantially equal to an output voltage of said inverter;

(ii) an amplification mode in which each inverter of said inverter pair receives and amplifies a bit line voltage from a respective bit line of said bit line pair and said inverters of said inverter pair are isolated from each other; and (iii) a latching mode in which said inverter pair is cross-coupled so that an output of each inverter of said inverter pair is supplied as an input to another inverter of said inverter pair.

The present techniques recognise that the inverter pair within the sense amplifier circuitry can be configured to operate in different modes in a manner in which improves memory performance. In particular, rather than the inverter pair being statically cross-coupled, the interconnection between the inverter pair and the connection of the inverter pair to the bit lines may be configured by control circuitry to provide an offset compensation mode, an amplification mode and a latching mode. In each of these modes the inverter pair functions differently and the combination of the different modes of operation can provide an overall increase in performance.

In some embodiments the control circuitry is configured to switch the sense amplifier circuitry in turn through the offset compensation mode, the amplification mode and the latching mode when performing a read operation. Adopting each of these modes in turn first compensates for mismatch between the inverters, uses the inverters to amplify the voltage difference arising between the bit lines and then securely latches the voltage difference so as to generate an output signal.

In some embodiments the sense amplifier circuitry may comprise a pair of capacitors with each capacitor having a first terminal connected to an inverter and a second terminal connected to a bit line, at least during the amplification mode. A voltage difference arising between the bit lines is passed through the relevant capacitor to the input of a connected inverter, which then amplifies the change in voltage at its input to generate an amplified changing voltage at its output. Such an amplified voltage difference may more rapidly rise to a level at which it may be securely captured and latched thereby permitting a reduction in sensing time and accordingly an increase in speed of operation of the memory.

The control circuitry may be configured to connect the second terminals of the capacitors together during the offset compensation mode such that they adopt a shared voltage level. In this way, the offset in switching points between the two inverters may be absorbed in the voltage which generates across the respective capacitor thereby matching the two inverters to respond equally to voltage differences which are subsequently applied via the capacitors bearing the offset voltage.

In some embodiments the precharge operations are performed on the bit lines before a read operation and the sense amplifier circuitry includes input precharge circuitry which precharges the second terminals of the capacitors to this precharge voltage level as the shared voltage level. Precharging the capacitors in this way avoids disturbance of the read operation due to an inrush of charge to the capacitors when the bit lines are connected to the sense amplifying circuitry via, for example, column select transistors.

It will be appreciated that while in the offset compensation mode where the inverters are held at their trip point, the inverters will consume a relatively large current as they will be leaking. In order to reduce the energy consumed due to this leakage, the sense amplifiers circuitry is operated in the offset compensation mode for a proper subset of a precharge period as the necessary offset compensation may be achieved more rapidly than the precharging of the relatively long and high capacitance bit lines running through the array of bit cells.

In order to reduce power consumption, and potentially an unwanted discharge of the bit lines, the first terminal of each of the capacitors is isolated from the inverter during the latching mode.

While the present techniques could be used for advantage within memories having a variety of different types of bit cells, the present technique is suited to use in embodiments in which the bit cells are 6T bit cells (i.e. bit cells containing six transistors).

In order to reduce the impact upon area due to the prevision of the pair of capacitors, some embodiments are such that the pair of capacitors have a pitch dimension substantially equal to the pitch dimension of the sense amplifier circuitry such that these may be formed together within the memory circuitry in a manner which does not unduly increase the size of the memory circuitry.

It will be appreciated that while the pair of capacitors may be formed in a variety of different ways including, for example, as at least one of metal, poly silicon and/or trench capacitors, in some embodiments these capacitors may be formed as to metal layers separated by a metal oxide layer.

The capacitance of the pair of capacitors used has an impact upon the performance characteristics achieved for the memory circuitry. Depending upon which particular performance priorities are desired for the memory circuitry, the capacitance may be varied to provide, for example, a high degree of gain in the amplification of the voltage difference or a reduction in the duration of the amplification mode required to reliably read from the memory. However, in some embodiments the pair of capacitors may be sized to have a capacitance that results in a substantially maximum value for a product of the gain of the inverters during the amplification mode and then inverse of a minimum duration of the amplification mode required to reliably sense the bit line voltage.

Viewed from another aspect the present invention provides a memory circuitry comprising:

an array of bit cell means for storing data comprising a plurality of columns of bit cell means;

a plurality of bit lines pairs each coupled to a respective column of bit cell means within said array; and sense amplifier means for sensing a voltage difference between bit lines of said at least one of said plurality of bit line pairs; wherein said sense amplifier means comprises an inverter pair and control means for controlling said sense amplifier means to operate in a plurality of modes including:
  (i) an offset compensation mode in which said inverter pair is isolated from said bit lines and each inverter of said inverter pair adopts a state corresponding to a trip point at which an input voltage of said inverter is substantially equal to an output voltage of said inverter;
  (ii) an amplification mode in which each inverter of said inverter pair receives and amplifies a bit line voltage from a respective bit line of said bit line pair and said inverters of said inverter pair are isolated from each other; and
  (iii) a latching mode in which said inverter pair is cross-coupled so that an output of each inverter of said inverter pair is supplied as an input to another inverter of said inverter pair.

Viewed from a further aspect the present invention provides a method of reading data from memory circuitry comprising:

an array of bit cells comprising a plurality of columns of bit cells;

a plurality of bit lines pairs each coupled to a respective column of bit cells within said array; and sense amplifier circuitry coupled to at least one of said plurality of bit line pairs and configured to sense a voltage difference between bit lines of said at least one of said plurality of bit line pairs; said method comprising the step of:

operating said sense amplifier circuitry in an offset compensation mode in which said inverter pair is isolated from said bit lines and each inverter of said inverter pair adopts a state corresponding to a trip point at which an input voltage of said inverter is substantially equal to an output voltage of said inverter;

operating said sense amplifier circuitry in an amplification mode in which each inverter of said inverter pair receives and amplifies a bit line voltage from a respective bit line of said bit line pair and said inverters of said inverter pair are isolated from each other; and operating said sense amplifier circuitry in a latching mode in which said inverter pair is cross-coupled so that an output of each inverter of said inverter pair is supplied as an input to another inverter of said inverter pair.

The above, and other objects, features and advantages of this invention will be apparent from the following detailed description of illustrative embodiments which is to be read in connection with the accompanying drawings.

DESCRIPTION OF THE EMBODIMENTS

Figure 1:
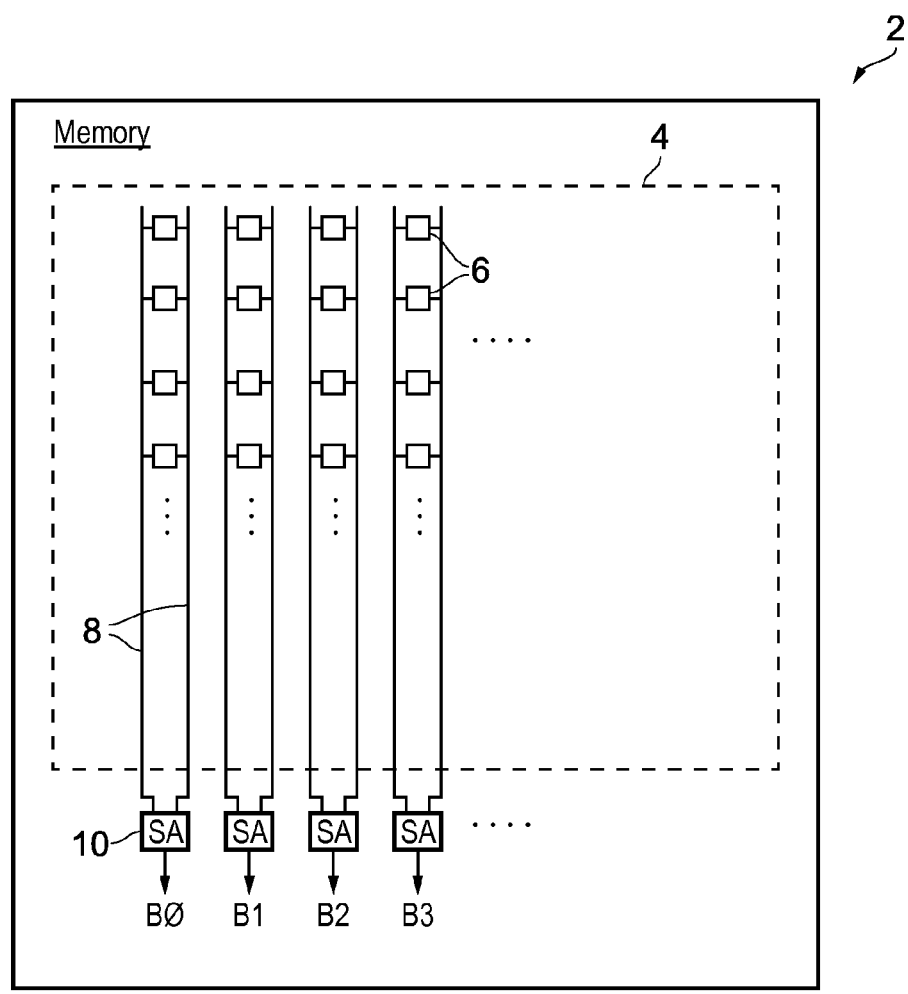
FIG. 1 schematically illustrates an integrated circuit memory including an array of bit cells with bit lines running therethrough connecting to respective sense amplifier circuitry.

FIG. 1 schematically illustrates memory circuitry 2 including an array 4 of bit cells 6. The bit cells 6 are arranged in columns which are connected via respective bit line pairs 8 to sense amplifier circuitry 10. When a read operation is performed, the bit lines 8 are precharged to a precharge level and then one of the bit lines is selectively discharged from the precharged level in dependence upon the bit value stored within the bit cell being read. The sense amplifier circuitry 10 is switched on after a certain duration of discharge and the voltage difference between the bit lines is sensed and used to set a latched value from the sense amplifier circuitry 10 as the read data value, e.g. bit value B0.

Figure 2:
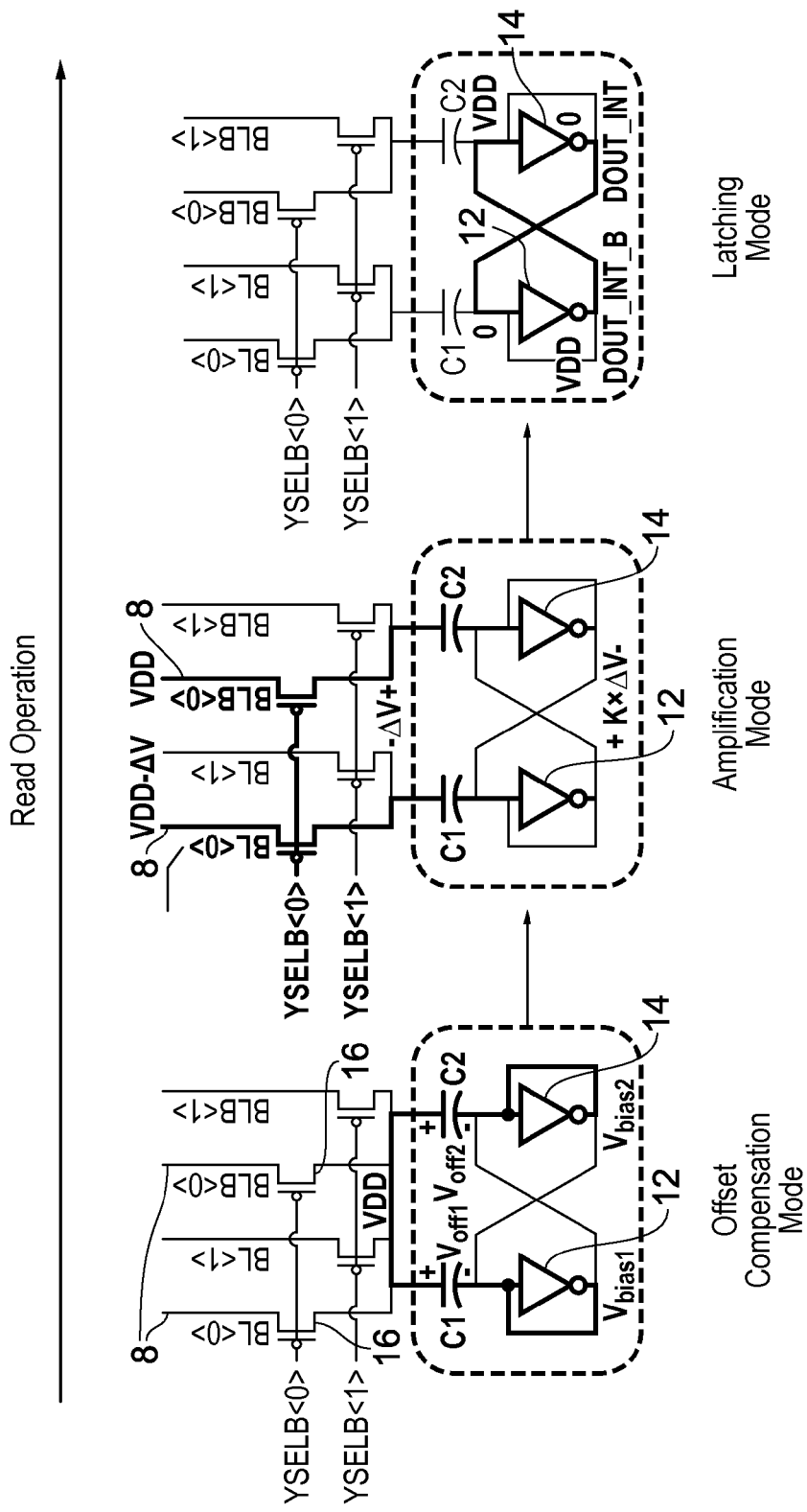
FIG. 2 schematically illustrates three modes of operation of sense amplifier circuitry.

The sense amplifying circuitry 10 includes a pair of inverters 12, 14. FIG. 2 schematically illustrates a portion of the sense amplifier circuitry including the inverters 12, 14 operating in different modes during a read operation. During a read operation, the sense amplifier circuitry 10 operates in turn in a sequence of modes including an offset compensation mode, an amplification mode and a latching mode.

A pair of capacitors C1, C2 are provided with a first terminal connected to the input of a respective inverter 12, 14 and a second input selectively connected to the bit lines 8 via column select transistors 16. In the example illustrated, 2:1 multiplexing of bit lines to the sense amplifier circuitry 10 is employed, although this is an implementation detail and may be different in other embodiments where no multiplexing may be employed or a higher degree of multiplexing employed.

During the offset compensation mode, the inverters 12, 14 are isolated from the respected bit lines by virtue of the column select transistors 16 being switched to a high impedance state. The output of each inverter 12, 14 is connected to its own input and this serves to hold the inverter in the state corresponding to its trip point at which its input voltage is substantially equal to its output voltage. The characteristics of the inverters 12, 14 may differ due to device mismatch and accordingly the input voltage for each which corresponds to the trip point may vary. The inputs to each of the inverters 12, 14 are coupled to a respective first terminal of one of the capacitors C1, C2. The second terminal of each of the capacitors C1, C2 is connected to the supply rail voltage Vdd which is the same voltage to which the bit lines 8 are precharged. A consequence of this is that offset voltages Voff1 and Voff2 respectively develop across the capacitors C1 and C2 and provide an auto-zeroing offset compensation between the inverters 12, 14 in respect of how they will react to subsequently supplied input voltages supplied from the bit lines 8.

During the amplification mode which follows the offset compensation mode, the inverters 12, 14 are isolated from one another, but are now connected to receive the voltages on the respective ones of the bit lines 8 via the capacitors C1 and C2. As the inverters 12, 14 have previously been placed into a state corresponding to there trip point during the offset compensation mode, this state is one which corresponds to a high gain for the inverters for changes in input voltage level resulting in changes in output voltage level. Thus, a voltage difference of ΔV appearing between the two inputs to the inverters 12, 14 is amplified to a voltage difference of K×ΔV. The consequent increased speed with which the difference between the outputs of the inverters 14 reaches a level sufficient to the reliably captured and latched with the sense amplifier circuitry 10 enables the read operation to be made quicker.

In the latching mode the inverters 12, 14 are cross-coupled such that the input to one inverter is taken from the output of the other inverter and visa versa. The inputs to the inverters are also isolated from the capacitors C1, C2 via isolation gates (not illustrated in FIG. 2).

In the example illustrated in FIG. 2, the bit line BL<0> is discharged during the read operation and accordingly the input to inverter 12 is latched low while the input to inverter 14 is latched high (namely Vdd).

Figure 3:
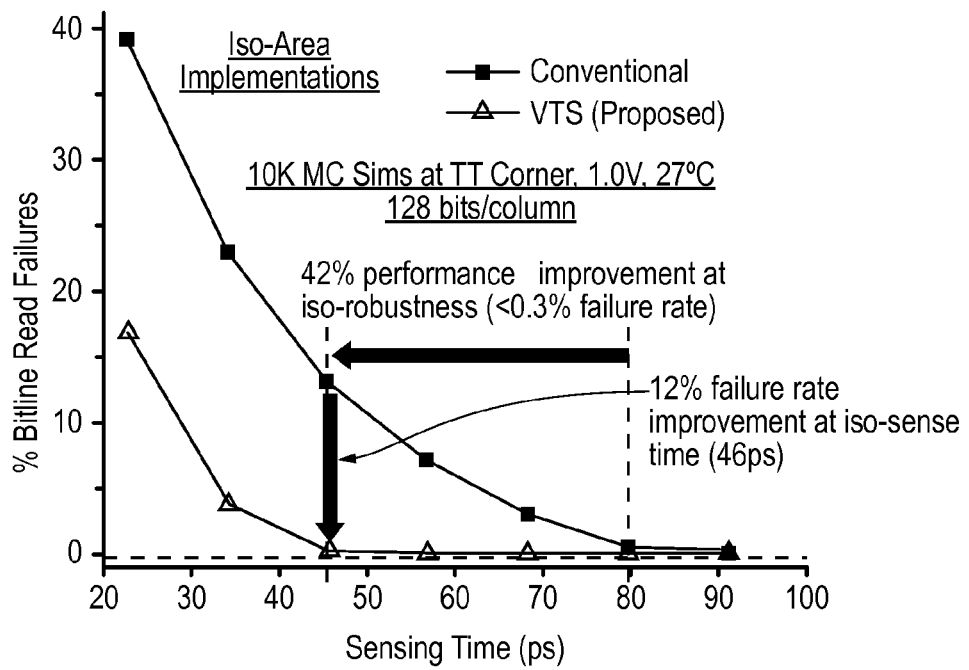
FIG. 3 schematically illustrates performance improvements which may, in some example embodiments, be achieved using the different modes of operation of FIG. 2.

FIG. 3 schematically illustrates the performance improvements which are indicated as achieved by one example embodiment of the present techniques over a conventional sense amplifier circuit. The implementations are iso-area implementations. It will be appreciated that different performance behaviour may be achieved with different example embodiments.

Figure 4:
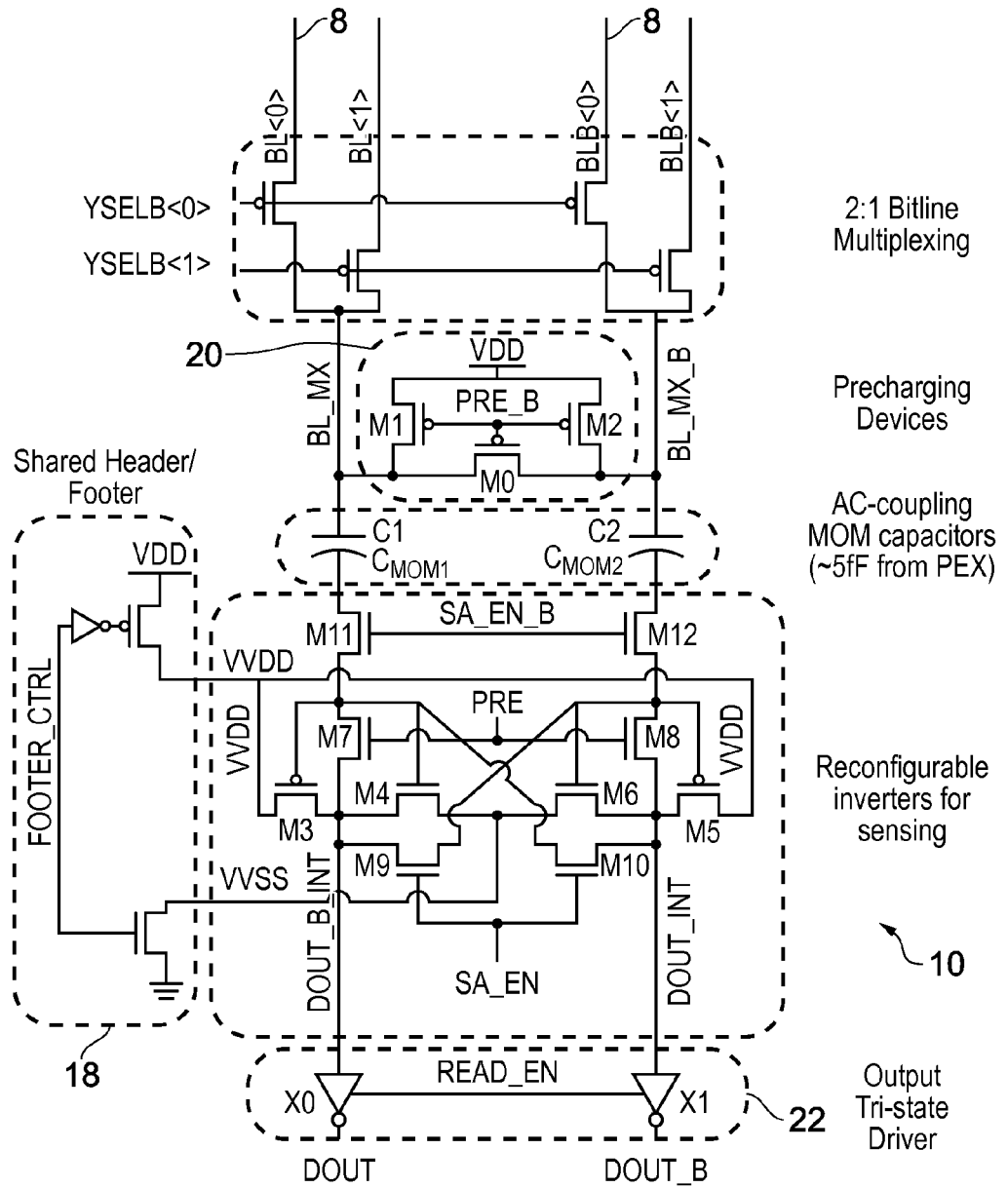
FIG. 4 schematically illustrates in more detail an example embodiment of sense amplifying circuitry including an inverter pair, a pair of capacitors and control circuitry for controlling the sense amplifying circuitry to adopt different modes of operation.

FIG. 4 illustrates an example embodiment of the sense amplifier circuitry 10 in more detail. Transistors M3 and M4 comprise one inverter. Transistors M5 and M6 comprise another inverter. Transistors M7, M8, M9 and M10 are used to reconfigure the inverter connections for offset compensation (auto-zeroing), amplification and latching modes. The transistors M11 and M12 serve to isolate the capacitors C1 and C2 during the latching mode to prevent a full scale voltage swing at nodes BL_MX/BL_MX_B that could otherwise turn on the bit line multiplexer switches (column select transistors) and adversely impact performance.

It will be appreciated that this example embodiment is illustrated with 2:1 bit line multiplexing. Other embodiments may not use multiplexing at all or a higher degree of multiplexing. A given column of bit lines may have one pair of bit lines associated with it, e.g. BL<0>,BLB<0> or may in multiplexed embodiments have a plurality of bit line pairs associated with it. The bit cells 6 are in this example embodiment 6T bit cells comprising six transistors and according are sensed using bit line pairs 8. Each column of bit cells 6 accordingly has one bit line pair 8 associated with it. As the array 4 of bit cells 6 contains a plurality of columns of bit cells 6, the array will accordingly contain a plurality of bit line pairs 8 with at least one bit line pair 8 associated with each column of bit cells 6.

Also illustrated in FIG. 4 is footer control circuitry 18, which is shared between multiple sense amplifier circuits 10 and serves us part of the control circuitry 4 controlling the switching of the sense amplifier circuitry 10 between its different modes of operation.

Precharging circuitry 20 is coupled to the second terminals of the capacitors C1, C2 and serves to precharge these nodes to the Vdd voltage to which the bit lines 8 are also precharged during a precharging period. Output tri-state driver circuitry 22 receives the outputs from the inverters 12, 14 and generates a data output corresponding to the result of the read operation. The sense amplifier circuitry 10 can be switched off once the data has been read and stored for output by the tri-state driver circuitry 22.

Figure 5:
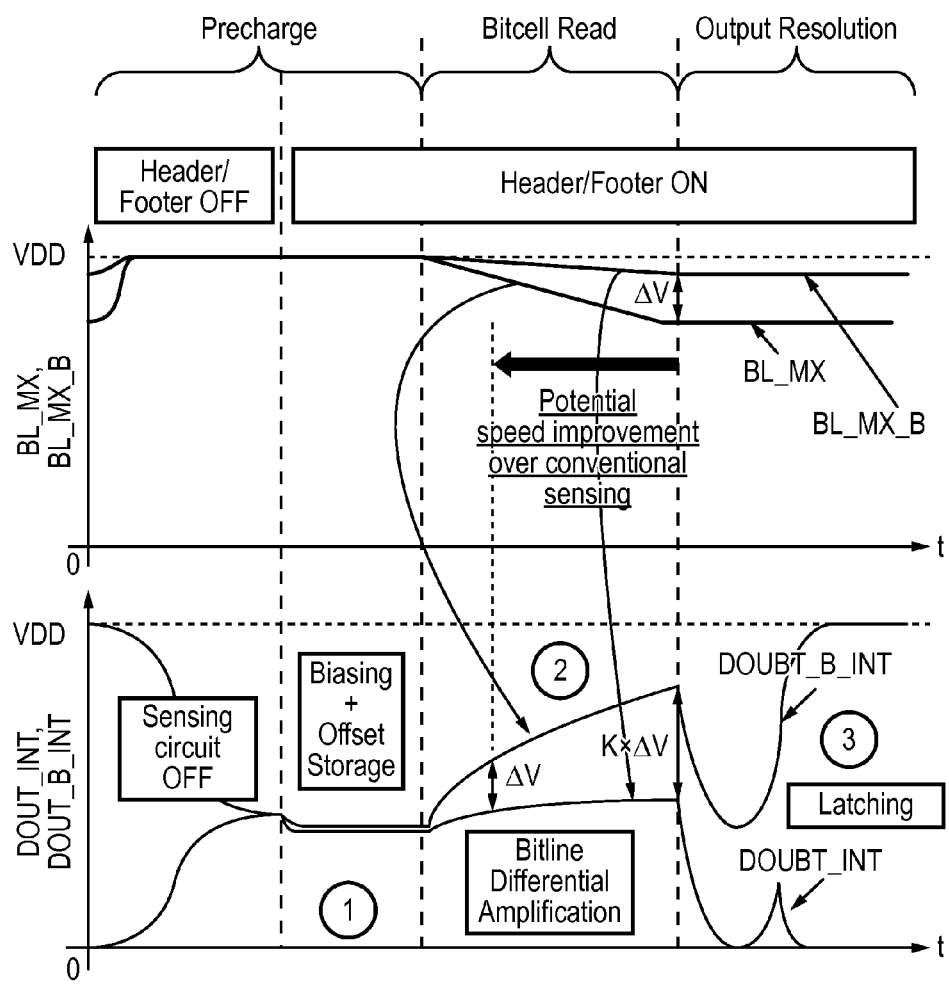
FIG. 5 is a signal diagram schematically illustrating the operation of the circuit of FIG. 4.

FIG. 5 is a signal diagram schematically illustrating the variation in signal level of named signals within the circuit of FIG. 4 during a read operation. The bit lines 8 are precharged during a precharged operation. For the first portion of this precharge operation, the footer control circuitry 18 switches off the power supplied to the sense amplifier circuitry 10. During a final period of the precharging, the footer control circuitry 18 switches the sense amplifier circuitry 10 into the offset compensation mode labelled biasing and offset storing in FIG. 5. During this mode of operation the inverter pair 12, 14 is isolated from each of the bit lines 8 and each inverter of the inverter pair 12, 14 adopts a state corresponding to a trip point at which its input voltage is substantially equal to its output voltage as these are coupled together through transistors M7 and M8 respectively.

At the end of the offset compensation mode, the sense amplifier circuitry 10 enters the amplification mode (labelled bit line differential amplification in FIG. 5). During this mode the inverters of the inverter pair 12, 14 are isolated from each other (at least within the sense amplifying circuitry 10 itself) and are connected to received respective bit line voltages from the bit lines 8 which are amplified by the inverters 12, 14.

Following the amplification mode, the sense amplifier circuitry 10 enters a latching mode (labelled latching in FIG. 5)

in which the inverters 12, 14 are cross-coupled so that the input of one inverter is coupled to the output of the other inverter via transistors M9 and M10 of FIG. 4. The transistors M11 and M12 are also switched off during the latching mode so as to isolate the inverters 12, 14 from the bit line voltages.

Figure 6:
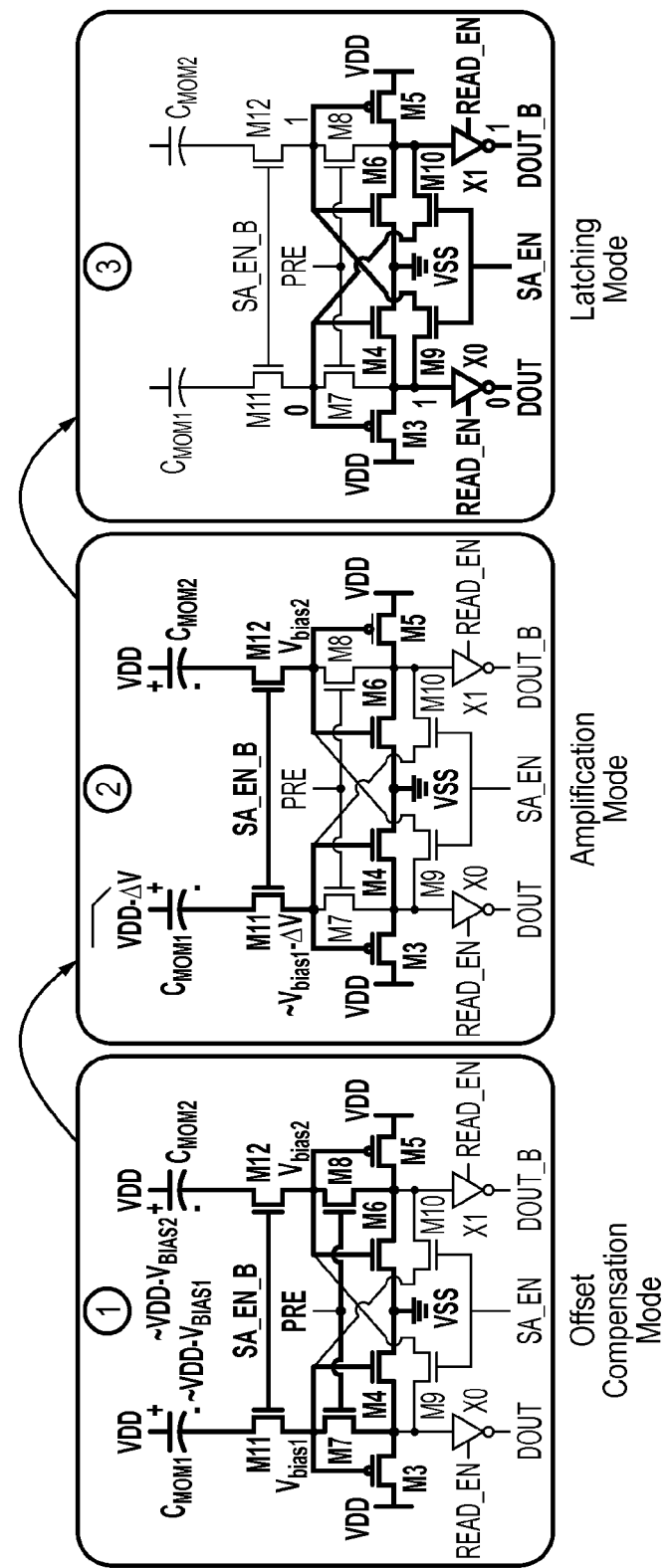
FIG. 6 is a diagram schematically illustrating a portion of the circuit of FIG. 4 with different circuit elements highlighted depending upon which circuit elements are active in which mode of operation.

FIG. 6 is a diagram schematically illustrating those portions of the sense amplifying circuitry of FIG. 4 which are active during the respective modes of operation. Each of these modes of operation is performed in turn as part of the overall read operation.

Figure 7:
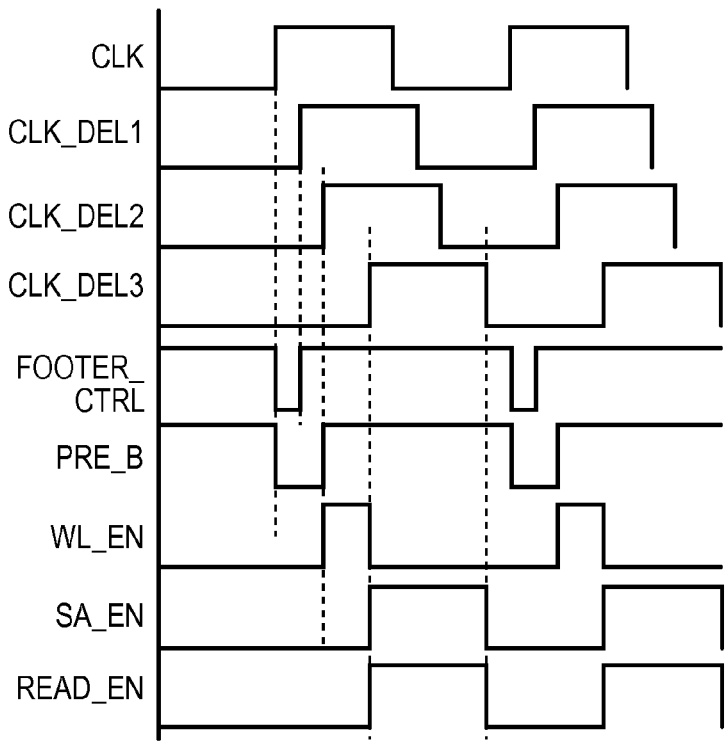
FIG. 7 is a signal diagram illustrating the relative timing of various control signals used in controlling the circuit of FIG. 4.

FIG. 7 is a signal diagram schematically illustrating the relevant timing of various control signals used in controlling the circuit of FIG. 4. An overall clock signal clk is a clock signal used to drive the memory circuitry. Various delayed versions of this clock signal are derived therefrom in a manner which will be familiar to those in this technical field. The main clock signal and the delayed versions of the clock signal are then used to generate a signal for controlling the tfooter control circuitry 18, namely FOOTER_CTRL. The precharge circuitry 20 is controlled by a precharge controlling signal PRE_B. A word line enable signal WL_EN is used to access a row of bit cells 6 within the array 4 in the conventional manner. A sense amplifier enable signal SA_EN is used to enable the sense amplifying circuitry 10 and a read enable signal READ_EN is used to enable the tri-state driver circuitry 22.

As will be seen from FIG. 7 the footer control circuitry 18 controlling signal FOOTER_CTRL overlaps with the precharge controlling signal PRE_B. The period when the precharge signal PRE_B is high and the footer circuit control signal FOOTER_CTRL is high corresponds to the offset compensation mode of the sense amplifier circuitry 10, as illustrated in the left most portion of FIG. 6. The amplification mode corresponds to the period when the word line enable signal WL_EN is high and before the sense amplifier enable signal SA_EN goes high. The latching mode is when the sense amplifier enable signal SA_EN is high.

Figure 8:
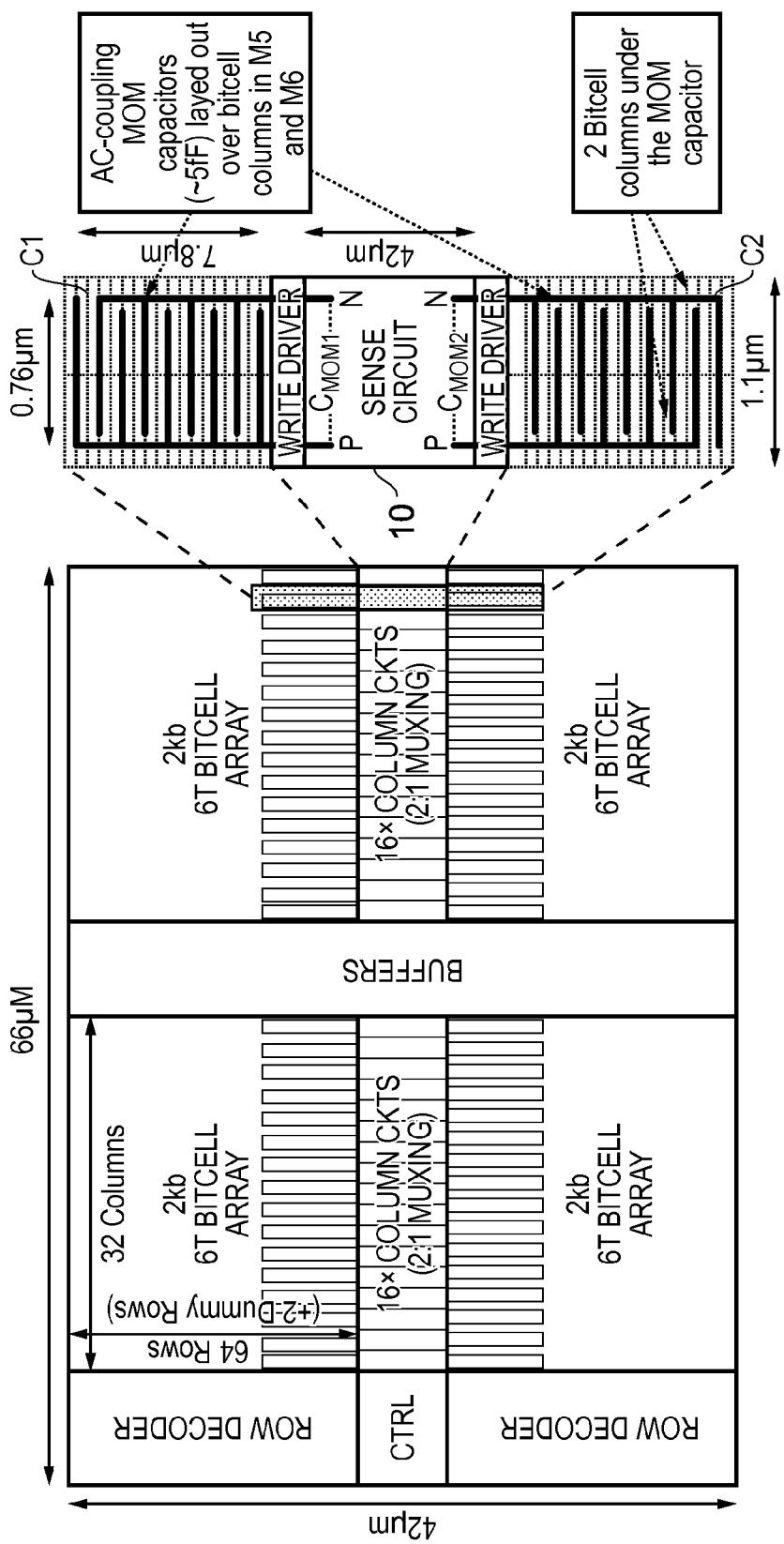
FIG. 8 schematically illustrates the layout of one example of memory circuitry utilising the present techniques.

FIG. 8 schematically illustrates a memory circuit layout incorporating the present techniques. The capacitors C1 and C2 are formed with a pitch which matches the pitch of the sense amplifier circuitry 10. The capacitors C1 and C2 may be formed of two metal layers with a metal oxide layer disposed there between. These metal layers may be formed in the upper fabrication layers of the integrated circuit. In other embodiments the upper fabrication layers may be used for routing and power such that the capacitors are formed using layers below the top and/or layers that are not metal. In some embodiments, the capacitors include at least one of metal, poly-silicon, diffusion and/or trench capacitors. The capacitance of the capacitors C1, C2 is selected so as to substantially maximise the value of a product of the gain of the inverters 10, 12 during amplification mode and an inverse of the minimum duration of the amplification mode required to reliably sense the bit line voltage. This may be considered maximising the product of the gain and the bandwidth of and through the inverters 12, 14.

Figure 9:
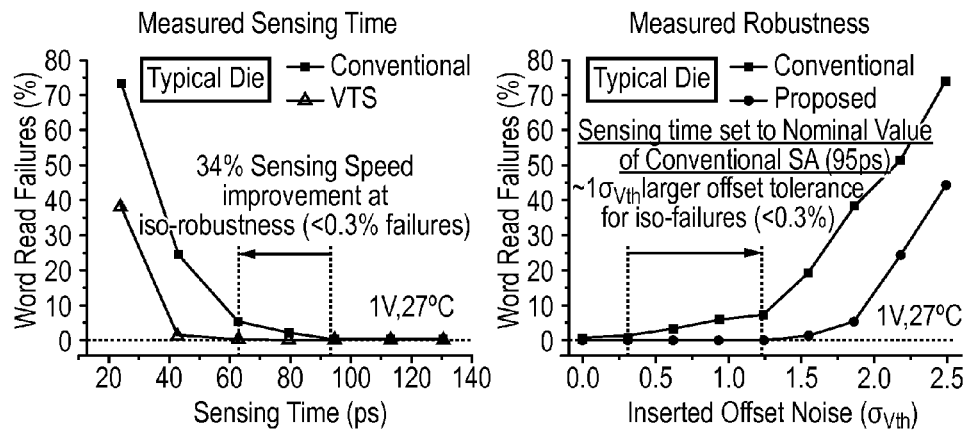
FIG. 9 schematically illustrates measured performance improvements for one example memory circuitry utilising the present techniques.

FIG. 9 schematically illustrates performance improvements in terms of sensing time and robustness achieved for example implementations of the present technique.

Figure 10:
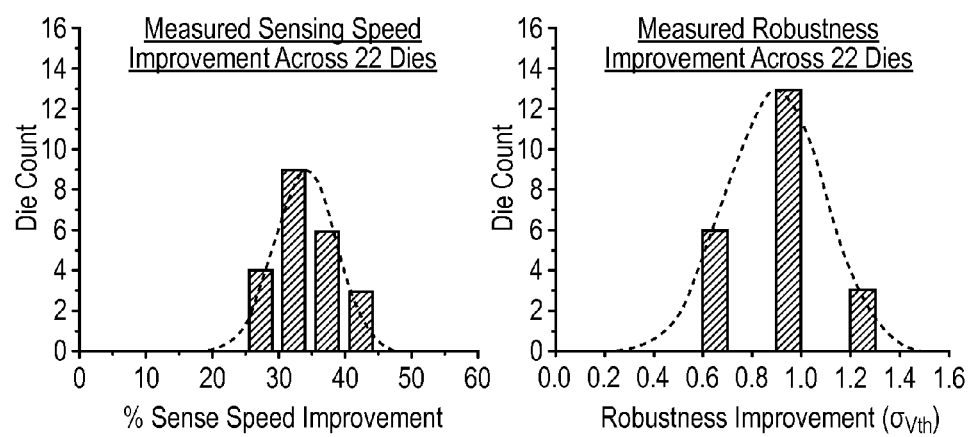
FIG. 10 schematically illustrates performance improvements measured across multiple instances of example memory circuits in accordance with the present techniques.

FIG. 10 illustrates results measured from 22 examples dyes of memory circuits manufactured in accordance with the present techniques showing achieved speed and robustness improvements.

The present techniques, at least in some example embodiments, provide sense amplifier circuitry 10 which is less sensitive to device mismatch. The sense amplifier circuitry 10 is able to support more rapid read operations thereby improving the maximum speed of read which may be achieved. It will be appreciated by those in this technical field that speed of operation may be traded against robustness (error rate) in order to achieve a desired performance point.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Memory circuitry comprising:
an array of bit cells comprising a plurality of columns of bit cells;
a plurality of bit lines pairs each coupled to a respective column of bit cells within said array; and
sense amplifier circuitry coupled to at least one of said plurality of bit line pairs and configured to sense a voltage difference between bit lines of said at least one of said plurality of bit line pairs; wherein
said sense amplifier circuitry comprises an inverter pair and control circuitry configured to control said sense amplifier circuitry to operate in a plurality of modes including:
(i) an offset compensation mode in which said inverter pair is isolated from said bit lines and each inverter of said inverter pair adopts a state corresponding to a trip point at which an input voltage of said inverter is substantially equal to an output voltage of said inverter;
(ii) an amplification mode in which each inverter of said inverter pair receives and amplifies a bit line voltage from a respective bit line of said bit line pair and said inverters of said inverter pair are isolated from each other; and
(iii) a latching mode in which said inverter pair is cross-coupled so that an output of each inverter of said inverter pair is supplied as an input to another inverter of said inverter pair.

2. Memory circuitry as claimed in claim 1, wherein said control circuitry is configured to switch said sense amplifier circuitry in turn through said offset compensation mode, said amplification mode and said latching mode when performing a read operation.

3. Memory circuitry as claimed in claim 1, wherein said sense amplifier circuitry comprises a pair of capacitors, each capacitor of said pair of capacitors having a first terminal and a second terminal and said control circuitry is configure to connect, during said amplification mode, an input of a respective inverter to a corresponding bit line via said first terminal, said capacitor and said second terminal.

4. Memory circuitry as claimed in claim 3, wherein said control circuitry is configure to connect, during said said offset compensation mode, second terminals of said capacitors together to share a shared voltage level.

5. Memory circuitry as claimed in claim 4, wherein said bit lines are precharged during a precharge period to a precharged voltage level before a read operation and said sense amplifier circuitry comprises input precharging circuitry configured to precharge said second terminals of said capacitors to substantially said precharged voltage level as said shared voltage level.

6. Memory circuitry as claimed in claim 1, wherein said bit lines are precharged during a precharge period to a precharged voltage level before a read operation and said control circuitry is configured to control said sense amplifier circuitry to operate in said offset compensation mode for a proper subset of said precharge period.

7. Memory circuitry as claimed in claim 3, wherein said control circuitry is configured to isolate said first terminal from said inverter during said latching mode.

8. Memory circuitry as claimed in claim 1, wherein said bit cells at 6T bit cells.

9. Memory circuitry as claimed in claim 3, wherein said pair of capacitors have a pitch dimension substantially equal to a pitch dimension of said sense amplifier circuitry excluding said pair of capacitors.

10. Memory circuitry as claimed in claim 3, wherein said pair of capacitors are formed of two metal layers separated by a metal oxide layer.

11. Memory circuitry as claimed in claim 3, wherein said pair of capacitors are sized to have a capacitance that results in a substantially maximum value for a product of:
   (i) gain of said inverters during said amplification mode; and
   (ii) an inverse of a minimum duration of said amplification mode required reliably to sense said bit line voltage.

12. Memory circuitry comprising:
   an array of bit cell means for storing data comprising a plurality of columns of bit cell means;
   a plurality of bit lines pairs each coupled to a respective column of bit cell means within said array; and
   sense amplifier means for sensing a voltage difference between bit lines of said at least one of said plurality of bit line pairs; wherein
   said sense amplifier means comprises an inverter pair and control means for controlling said sense amplifier means to operate in a plurality of modes including:
      (i) an offset compensation mode in which said inverter pair is isolated from said bit lines and each inverter of said inverter pair adopts a state corresponding to a trip point at which an input voltage of said inverter is substantially equal to an output voltage of said inverter;
      (ii) an amplification mode in which each inverter of said inverter pair receives and amplifies a bit line voltage from a respective bit line of said bit line pair and said inverters of said inverter pair are isolated from each other; and
      (iii) a latching mode in which said inverter pair is cross-coupled so that an output of each inverter of said inverter pair is supplied as an input to another inverter of said inverter pair.

13. A method of reading data from memory circuitry comprising:
   an array of bit cells comprising a plurality of columns of bit cells;
   a plurality of bit lines pairs each coupled to a respective column of bit cells within said array; and
   sense amplifier circuitry including an inverter pair and coupled to at least one of said plurality of bit line pairs and configured to sense a voltage difference between bit lines of said at least one of said plurality of bit line pairs; said method comprising the step of:
   operating said sense amplifier circuitry in an offset compensation mode in which said inverter pair is isolated from said bit lines and each inverter of said inverter pair adopts a state corresponding to a trip point at which an input voltage of said inverter is substantially equal to an output voltage of said inverter;
   operating said sense amplifier circuitry in an amplification mode in which each inverter of said inverter pair receives and amplifies a bit line voltage from a respective bit line of said bit line pair and said inverters of said inverter pair are isolated from each other; and
   operating said sense amplifier circuitry in a latching mode in which said inverter pair is cross-coupled so that an output of each inverter of said inverter pair is supplied as an input to another inverter of said inverter pair.

* * * * *